(12) United States Patent
Okada et al.

(10) Patent No.: US 6,500,291 B1
(45) Date of Patent: Dec. 31, 2002

(54) DEVICE AND METHOD FOR LAMINATION

(75) Inventors: Naoto Okada, Tsukuba (JP); Toshikatu Shimazaki, Tsukuba (JP); Takeshi Yoshida, Tsukuba (JP); Yoshitaka Minami, Hitachi (JP); Hiroshi Yamazaki, Hitachi (JP)

(73) Assignee: Hitachi Chemical Co. Ltd., Tokyo (JP)

(*) Notice: Subject to any disclaimer, the term of this patent is extended or adjusted under 35 U.S.C. 154(b) by 0 days.

(21) Appl. No.: 09/786,868
(22) PCT Filed: Sep. 10, 1999
(86) PCT No.: PCT/JP99/04939
§ 371 (c)(1),
(2), (4) Date: Mar. 12, 2001
(87) PCT Pub. No.: WO00/15354
PCT Pub. Date: Mar. 23, 2000

(30) Foreign Application Priority Data

Sep. 11, 1998 (JP) .............................. 10-257680
Sep. 30, 1998 (JP) .............................. 10-278203

(51) Int. Cl.$^7$ .............................................. B44C 1/165
(52) U.S. Cl. ................... 156/230; 156/234; 156/238; 156/247; 156/250; 156/289; 156/543; 156/555; 156/582; 156/584
(58) Field of Search ............................ 156/230, 233, 156/238, 239, 240, 241, 247, 277, 280, 281, 272, 344, 545, 549, 555, 580, 582, 584, 234, 250

(56) References Cited

U.S. PATENT DOCUMENTS 4,060,441 A * 11/1977 Ohta et al. .................. 156/234

FOREIGN PATENT DOCUMENTS

JP          08-160216 A  *  6/1996  ............ G02B/5/20

* cited by examiner

Primary Examiner—Jerry A. Lorengo
(74) Attorney, Agent, or Firm—Antonelli,Terry,Stout, & Kraus, LLP

(57) ABSTRACT

A lamination device for performing a lamination method for a dry film resist as a transfer layer, comprising a substrate transport part (15), a substrate preheating part (8), a lamination part (9) and, (10), an inter-substrate film processing part (3), a film feed part (2), a film accumulation part (4), a base film continuous peeling part (12, 13), and a cover film continuous peeling part (5), wherein a lamination is carried out by a pair of lamination rolls (9) and (10), part (15) being transport rolls, a base film is peeled off from a substrate after lamination, a guide roll (12) for peeling off the base film is located forward of the lamination rolls in the transport direction of the substrate, and the guide roll is free to move vertically or laterally, whereby an angle between a substrate surface and the base film being wound up, i.e., the peeling angle of the base film can be changed to any angle.

22 Claims, 7 Drawing Sheets

| Controlling items | State | State of Substrate being laminated | | | | | |
|---|---|---|---|---|---|---|---|
| | | Standby t | Start t | Frontal end part | Rear end part | Finish t | Standby t |
| Lamination roll 9 | Rising | | | | | | |
| | Pressing | | | | | | |
| Lamination roll 10 | Descending | | | | | | |
| | Pressing | | | | | | |
| Guide roll 11 for standby | Rising | | | | | | |
| | Descending | | | | | | |
| peeling guide roll 12 | Rising | | | | | | |
| | Descending | | | | | | |
| Heat shield plate 16 | Shielding | | | | | | |
| | Standby | | | | | | |

DEVICE AND METHOD FOR LAMINATION

TECHNICAL FIELD

This invention relates to a method and a device both for continuously laminating onto substrates a transfer layer of a lengthy laminate film comprising a base film and the transfer layer and a cover film which are formed on the base film in this order.

BACKGROUND ART

There have been proposed various methods for laminating onto substrates a transfer layer formed on a base film. For example, Japanese Patent Application Unexamined Publication No. 3-205134 (1991) discloses a method wherein first a laminate film is cut at its frontal side perpendicularly to the feeding direction of the laminate film, and after the frontal end part of the laminate film is pressed onto the frontal end part of a substrate relative to the transport direction of the substrate, the laminate film is continuously fed and laminated onto the substrate by lamination rolls. The laminate film is also cut to form a rear end located to give a length corresponding to that of the substrate, and lamination is carried out, with the rear end of the laminate film supported. This method involves the problem that the transfer layer or intermediate layer of the laminate film is thermally fluidized during lamination, and squeezed out from the cut ends of the laminate film, adhering to and contaminating substrates. Further, because the laminate film is laminated after cut to the length between the frontal end and rear end of the substrate, the laminate film is applied with varied tensions and wrinkles due to uneven thickness and deflection. The method involves another problem of low productivity since the temporary attachment of the laminate film prior to lamination temporarily stops the lamination operation and disables speeding up, and the base film should be peeled off after lamination.

Another method is disclosed in Japanese Patent Application Unexamined Publication No. 5-338040 (1993). After the cover film of a laminate film is peeled off, cut-lines are made in the transfer layer with cutters to form boundaries dividing the lamination layer into parts to be attached between the frontal and rear end parts of substrates and other parts not to be transferred, and lamination is carried out, with the cut-lines fitted to substrates. Lamination rolls ceases pressing operation in the region including the frontal and rear end parts of the substrates and the interval between substrates, where lamination is not necessary. After the transfer layer is laminated onto substrates by continuously repeating the lamination operation, the base film of the laminate film is continuously peeled off from the substrates. The base film is peeled off, leaving only the necessary parts of the transfer layer between the cut-lines forming the frontal and rear ends. There is disclosed another method whereby the photosensitive layer to be located at the spaces between substrates is removed previously.

At low operating speeds of about 0.5 to 0.8 m/min, the method prevents the transfer layer from adhering to and contaminating rolls between substrates. However, on high-speed lamination operation (1 to 3 m/min) requiring frequent ON-OFF switching of pressing rolls, the tension of the laminate film varies frequently, so that the laminate film shifts from the predetermined position, causing loss of the position accuracy of lamination, and lamination gets out of the prescribed position between the frontal and rear end parts of a substrate. Consequently, when the base film is peeled off, the cut-lines overlap with the ends of the substrates, whereby the transfer layer on the peeling face becomes difficult to peel off, or the transfer layer that should be attached with pressure to the surface of the substrate is also peeled off. Further, the ON-OFF switching of the pressing rolls varies the tension of the laminate film undergoing lamination, so that the transfer layer laminated on the substrate with pressure tends to have wrinkles and uneven thickness.

DISCLOSURE OF INVENTION

This invention provides a lamination device and a lamination method, which are improved in production efficiency because a transfer layer can be laminated speedily and accurately on the desired parts of substrates except the frontal and rear end parts thereof, without causing unevenness or wrinkling, and as well prevent the transfer layer from being squeezed out to form extraneous matter.

The lamination device of this invention comprises:
- a mechanism for exposing a transfer layer to be laminated onto substrates to light in a region of the transfer layer corresponding to end parts of a substrate, which end parts are located to laminate the resist onto the substrate between the end parts, and to the space between two substrates, so that the region of the transfer layer does not adhere to lamination rolls nor to the parts of substrates where the transfer of the resist is not required;
- a lamination mechanism;
- a substrate transport mechanism for feeding substrates to the lamination mechanism at prescribed intervals;
- a lengthy laminate film transport mechanism for feeding a lengthy laminate film comprising a base film and a transfer layer formed thereon to the lamination mechanism, so that the transfer layer faces the substrate; and
- a peeling mechanism for continuously peeling off the base film after lamination,
- wherein the lamination mechanism and the peeling mechanism comprise a pair of lamination rolls facing each other and a guide roll for peeling off the base film, which is located, in the transport direction of the substrates, forward of the lamination roll on the side of the lengthy laminate film.

The first lamination method of this invention comprises feeding, between a pair of lamination rolls facing each other, substrates fed at prescribed intervals and a lengthy laminate film comprising a base film and a transfer layer formed thereon, so that the transfer layer faces the substrate, and continuously peeling off the base film, and is characterized in that, at the frontal end part of each substrate, the base film is peeled off by a guide roll for peeling off the base film, which is located, in a transport direction of the substrates, forward of the lamination roll on the side of the lengthy laminate film and is smaller in diameter than the lamination roll being to be in contact with the lengthy laminate film, and, at a rear end part of each substrate, the base film is peeled off by the lamination roll on the side of the lengthy laminate film.

The diameter of the guide roll for peeling off the base film is preferably at most one-third as large as the diameter of the lamination roll on the side of the lengthy laminate film, and the guide roll for peeling off the base film preferably has a diameter of 30 mm or less.

The lamination roll on the side of the lengthy laminate film is preferably a heating roll, and the guide roll for peeling off the base film is preferably a non-heating roll.

The second lamination method of this invention comprises feeding, between a pair of lamination rolls facing each other, substrates fed at prescribed intervals and a lengthy laminate film comprising a base film and a transfer layer formed thereon, so that the transfer layer faces the substrate, and continuously peeling off the base film, and is characterized in that vacant spaces are provided between the lamination rolls and the lengthy laminate film by vertically moving the lamination rolls or guide rolls, the guide rolls being located, in the transport direction of the substrates, forward and backward of the lamination roll on the side of the lengthy laminate film, respectively.

It is preferable that, after the vacant spaces are provided between the lamination rolls and the lengthy laminate film by vertically moving the lamination rolls or the guide rolls, a heat shield plate is inserted in at least one vacant space. The heat shield plate preferably has a self-cooling function.

The guide roll located, in the transport direction of the substrate, forward of the lamination roll on the side of the lengthy laminate film preferably doubles as a guide roll for peeling off the base film.

The third lamination method is for continuously laminating onto substrates continuously fed at prescribed intervals a transfer layer of a lengthy laminate film comprising a base film and the transfer layer and a cover film which are formed on the base film in this order, and is characterized in comprising a step of continuously feeding the lengthy laminate film, a step of pressing heating bars against the lengthy laminate film from the outer surface of the cover film without cutting the cover film, to give the transfer layer a divided region corresponding to the total of the interval between two substrates and the widths of the end parts of one substrate where lamination is not required, a step of exposing the transfer layer to light at the region which lies between the heating bars and corresponds to the total of the interval between two substrates and the widths of the end parts of the substrates where lamination is not required, a step of continuously peeling off the cover film, a step of laminating the transfer layer onto the substrates, which is continuously fed and arranged at prescribed intervals, so that the divided region of the transfer layer made by the heating bars is positioned on the end parts of the substrates where lamination is not required, a step of half-cutting the base film on the substrates at the parts pressed by the heating bars, and a step of peeling off the cut base film together with the transfer layer that was exposed to light.

BRIEF DESCRIPTION OF DRAWINGS

FIG. 13 is a chart showing the changes in controlling items with passage of time.

BEST MODE FOR CARRYING OUT THE INVENTION

Hereinafter, An embodiment according to this invention will be described referring to drawings.

The drawings illustrate a lamination device used for carrying out the lamination of a dry film resist, which is a transfer layer. The lamination device comprises a substrate transport part, a substrate preheating part, a lamination part, an inter-substrate film processing part, a film feed part, a film accumulating part, a base film-continuous peeling part and a part for continuously peeling off a cover film.

Figure 1:
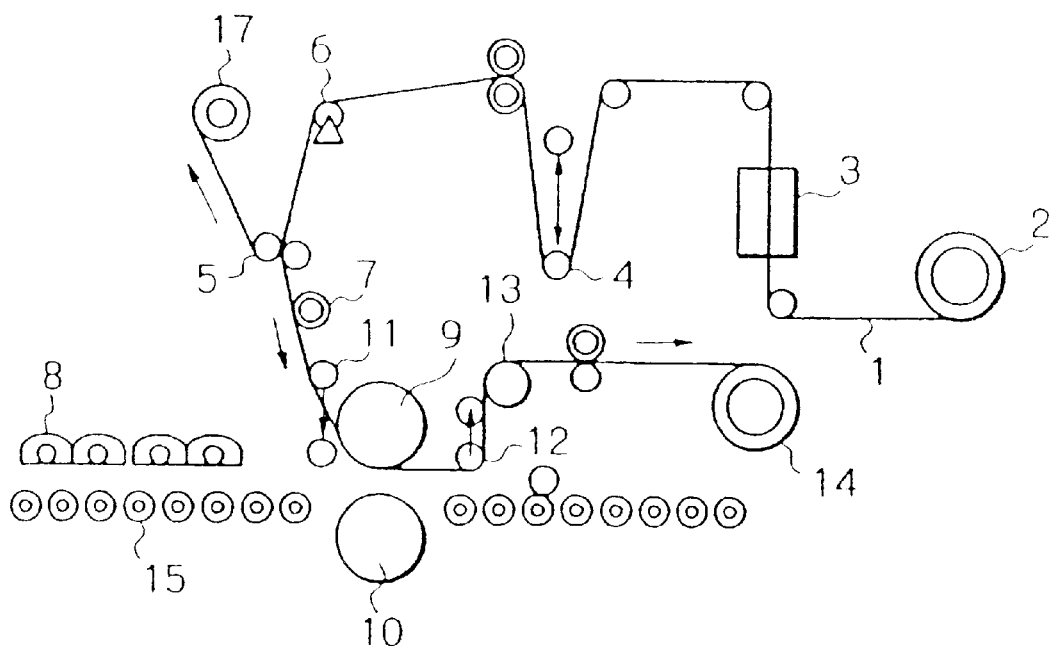
FIG. 1 is a conceptual view illustrating the lamination device of this invention.

A series of lamination steps will be described referring to FIG. 1.

Figure 2:
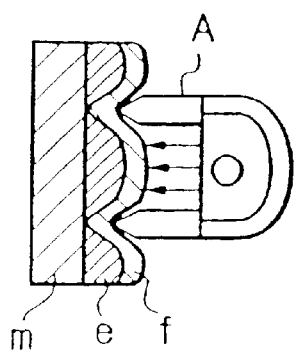
FIG. 2 is a sectional view illustrating an inter-substrate processing part used in the lamination device of this invention.

Lengthy laminate film 1 comprising a base film and a transfer layer and a cover film formed on the base film in this order is the film to be laminated, and is wound out from film feed part 2 and introduced to inter-substrate processing part 3, with the cover film attached thereto. FIG. 2 shows the details of the inter-substrate processing part. The inter-substrate processing part has two functions. By one function, the resist (transfer layer) is divided and, when laminated on substrates, has smooth cut sections. By the other function, the resist is partially exposed to light, so that the resist does not adhere to unnecessary parts, such as lamination rolls or the parts of substrates where the transfer of the resist is not required. The exposed part corresponds to the end parts of substrates, which are located so that the resist is laminated onto the substrate between the end parts, and to the space between two substrates. To divide the resist and smooth the cut sections, heating bars A are arranged at an interval overlapping the interval between substrates, and the interval between the heating bars corresponds to the total of the interval between two substrates and the width of the end parts of each substrate where lamination is not required.

Figure 3:
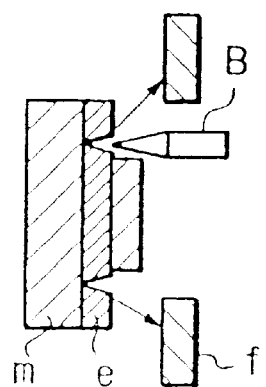
FIG. 3 is a sectional view illustrating an inter-substrate processing part of another embodiment used in the lamination device of this invention.

Alternatively, the methods disclosed in Japanese Patent Application Unexamined Publication Nos. 7-110575 (1995)

and 6-73343 (1994) may be used to prevent the parts requiring no transfer of the resist, such as lamination rolls or the parts of substrates where the transfer of the resist is not required, from being adhered with the parts of the resist that correspond to the space between substrates and the end parts of the substrates that are located so as to laminate the resist onto the substrate only between the end parts. According to the method disclosed in Japanese Patent Application Unexamined Publication No. 7-110575 (1995), prior to lamination, the cover film and the resist layer are half-cut by cutters B from the outer surface of the cover film without cutting the base film, and the cover film is peeled off only from the part to be laminated (FIG. 3). According to the method disclosed in Japanese Patent Application Unexamined Publication No. 6-73343 (1994), after the cover film is peeled off, lamination is carried out, with the part requiring no transfer applied with masking tape.

After passing through the inter-substrate processing part, the lengthy laminate film is accumulated in film accumulation part 4 by a length enough for one substrate. The above-described inter-substrate film processing is carried out while the flow of the lengthy laminate film is being temporarily stopped. Therefore, to continuously laminate the lengthy laminate film on the fed substrates without stagnation, the lengthy laminate film is previously subjected to the inter-substrate processing by a length enough for one substrate, and while the previously processed part is being laminated on a substrate, the inter-substrate processing of the film for the next substrate is carried out.

Figure 4:
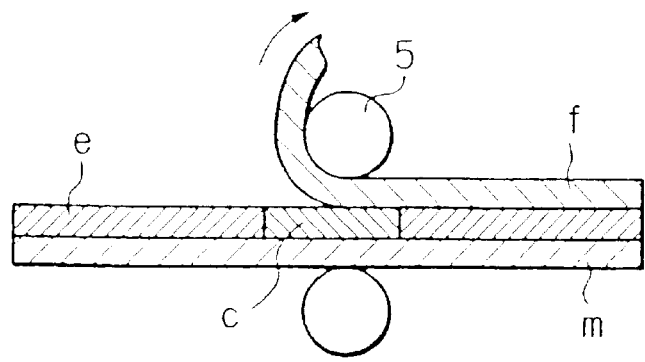
FIG. 4 is a sectional view illustrating the positional relation between a cover film being peeled off and inter-substrate processed part of a film.
Figure 5:
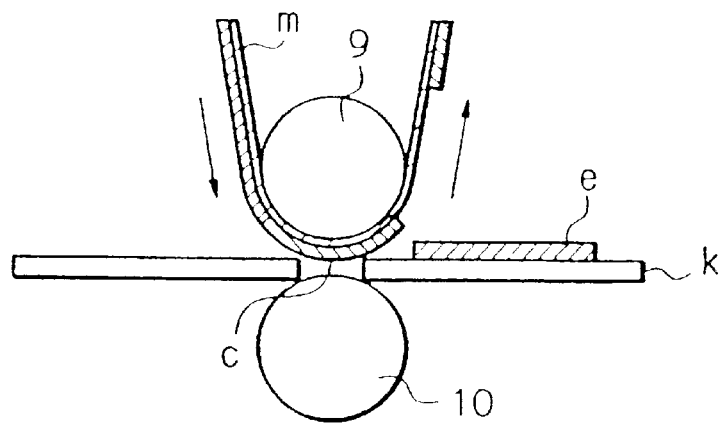
FIG. 5 is a sectional view illustrating a resist being transferred onto a substrate, and a base film being peeled off.

After the lengthy laminate film passed through the accumulation part, cover film f is wound up on cover film winding device 17 through cover film peeing guide 5 by a length of one substrate. The position of cover film peeling guide 5 is located so that when the flow of the lengthy laminate film is temporarily stopped to carry out the film inter-substrate processing, the position where the cover film is peeled off from the resist always comes to the center of the inter-substrate processed part c of the lengthy laminate film in the flow direction of the film (FIG. 4). In cases where peeling is carried out continuously, such adjustment of the position at which the peeling of the cover film is temporarily stopped is not necessary. After the cover film is peeled off, the lengthy laminate film is fed to lamination rolls. Based on the value measured by tension meter 6, tension controlling roll 7 works to keep the tension of the lengthy laminate film constant, irrespective of the vertical movements of rolls 9, 10, 11 and 12 or the operation or stoppage of lamination. On the other hand, the substrates to which the resist is to be transferred are fed to substrate preheating part 8, wherein a pre-heater (such as a far infrared heater) heats the substrates to a desired temperature (the temperature depends on the kind of the resist, and is generally 40 to 100° C.). After heated uniformly from both sides, the substrates are fed to a lamination part. The positions of the substrates and the lengthy laminate film are always controlled by a position control sensor or the like, so that, as shown in FIG. 5, the inter-substrate processed part c of the lengthy laminate film covers the end parts of the substrates and the space between the substrates.

Figure 6:
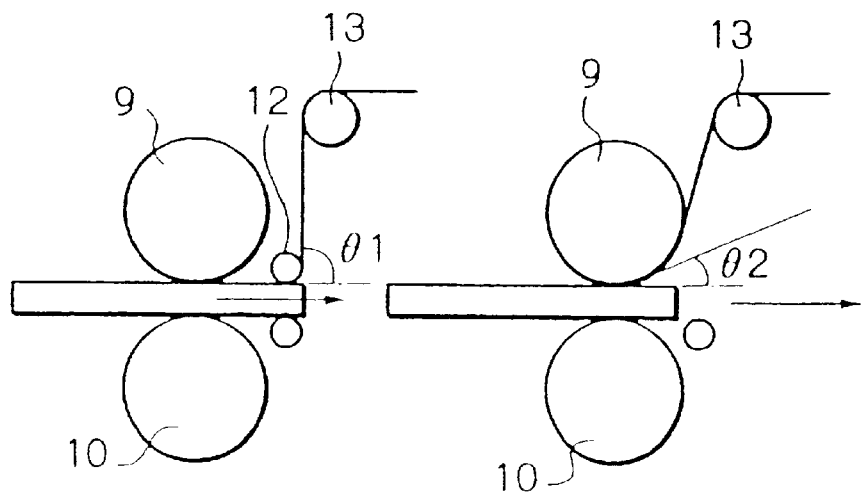
FIG. 6 is a sectional view illustrating the variation of peeling angles depending on the positions where a base film is peeled off.

A pair of lamination rolls 9 and 10 performs lamination. The parts 15 are transport rolls. After lamination, the base film is peeled off from the substrate. When the base film is peeled off from the substrate, the temperature of the substrate is close to the temperature of the rolls. Temperatures closes to the temperature of the rolls improve peelability more. For example, the resist films as disclosed in Japanese Patent Application Unexamined Publication No. 8-211222 (1996) are more suitable for continuous peeling of base films. Guide roll 12 for peeling off the base film is located forward of the lamination rolls in the transport direction of the substrates. The guide roll is free to move vertically or laterally, whereby the angle between the substrate surface and the base film being wound up, i.e., the peeling angle $\theta$ of the base film can be changed to any angle. As shown in FIG. 6, the angle $\theta$ can be changed to any angle depending on the base film peeling position on the substrate in the transport direction of the substrates. For example, at the lamination starting position, i.e., the frontal lamination end of the substrate in the transport direction of the substrate, the peeling angle $\theta$ can be increased. As shown in the left figure wherein the peeling angle $\theta=\theta_1$ ($\geq 90°$), the base film is peeled off via peeling guide roll 12 to increase the peeling angle. On the other hand, when peeling guide roll 12 is raised, the base film is peeled off via the lamination roll, whereby when the peeling guide roll is raised, the peeling angle $\theta=\theta_2$ ($<30°$) becomes smaller than the peeling angle $\theta=\theta_1$ ($\geq 90°$) of the peeling via the peeling guide roll ($\theta_1>\theta_2$). By controlling these peeling angles, the actual force applied for peeling can be controlled. In general, the force required to peeling a film is expressed by the following equation.

$$\text{Base film peeling force} = rb(1-\sin\theta)(0<\theta<90°)$$

r=thickness of resist film
b=interfacial adhesion energy
$\theta$=peeling angle

When r and b are constant, the force required for peeling becomes smaller the closer the peeling angle $\theta$ gets to 90° (the more the peeling angle increases), while the force required for peeling becomes larger the closer the peeling angle $\theta$ gets to 0° (the more the peeling angle decreases).

Figure 7:
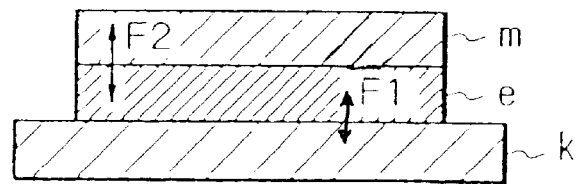
FIG. 7 is a sectional view illustrating the interlaminar adhesion in a film laminated onto a substrate.

FIG. 7 shows the relation between the interlaminar adhesion strength of the lengthy laminate film and the peelability of the base film. When the adhesion strength F1 between resist layer e and substrate k is related to the adhesion strength F2 between resist e and base film m (the base film peeling force corresponds to F2) by F1>F2, the resist can be transferred to the substrate, and the base film has good peelability. However, in many of actual films, F1 and F2 are almost balanced as expressed by F1>F2. Particularly, at the frontal end part of the substrate in the transport direction of the substrate where the base film starts to be peeled off, the resist cannot be transferred stably, thereby destroying the relation of F1>F2 and causing transfer errors. Therefore, at the frontal end part of the substrate in the transport direction of the substrate, the force necessary for peeling (F2) should be reduced previously. According to this invention, the peeling angle of the base film may be increased at the frontal end part of the substrate in the transport direction of the substrate where the base film starts to be peeled off, whereby the base film peeling force can be reduced and the resist can be transferred onto substrates continuously and stably.

Figure 8:
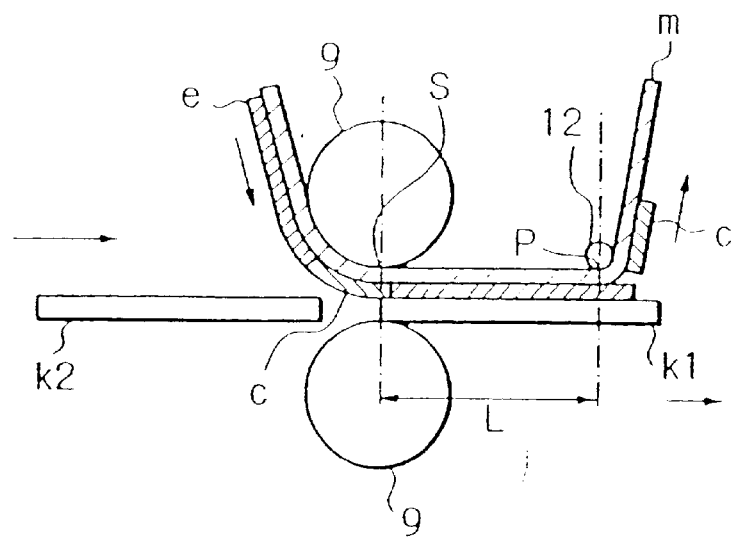
FIG. 8 is a sectional view illustrating the state of the position where peeling is performed by a guide roll for peeling a base film and a lamination roll.

As described above, the ability of the resist for transfer at the frontal end part of the substrate can be improved by increasing the base film-peeling angle at the frontal end part of the substrate in the transport direction of the substrate. However, in cases where the base film is peeled off apart from the lowest point S of the lamination roll by a distance L as shown in FIG. 8, the following problem arises. When substrates are continuously transported in sequence at constant intervals, the positional adjustment of the inter-substrate processed part c relative to the substrates can be performed sequentially even if the peeling position P of the base film is apart from the lamination position C (the lowest point S of the lamination roll), and the substrates can be discharged after the lamination of the resist and peeling of the base film. However, in cases where the substrates are not transported continuously at constant intervals, lamination should be temporarily stopped on standby until the next substrate is transported, with the position of the inter-substrate processed part fitted to the lowest point S of the lamination roll. In such cases, as shown in FIG. 8, substrate k1 transported just before standby stops under the inter-substrate processed part of the film at the lowest point S of the lamination roll, whereby peeling of the base film stops halfway, without completing. Until the next substrate K2 is transported, substrate K1 is allowed to stand without peeling off the base film. Consequently, substrates are allowed to stand for different periods, and sometimes adversely affect the properties of the resist.

To overcome the problem, we investigated a means of reducing the distance L between the lowest point S of the lamination roll and guide roll 12 for peeling off the base film. To minimize L, the diameter of peeling guide roll 12 should be reduced. However, it was found to be difficult due to the mechanical properties of peeling guide roll 12. According to the means employed in this invention, guide roll 12 for peeling off the base film is moved upward or to some other position, thereby moving the peeling position of the base film from peeling guide roll 12 to the lowest point S of the lamination roll.

Figure 9:
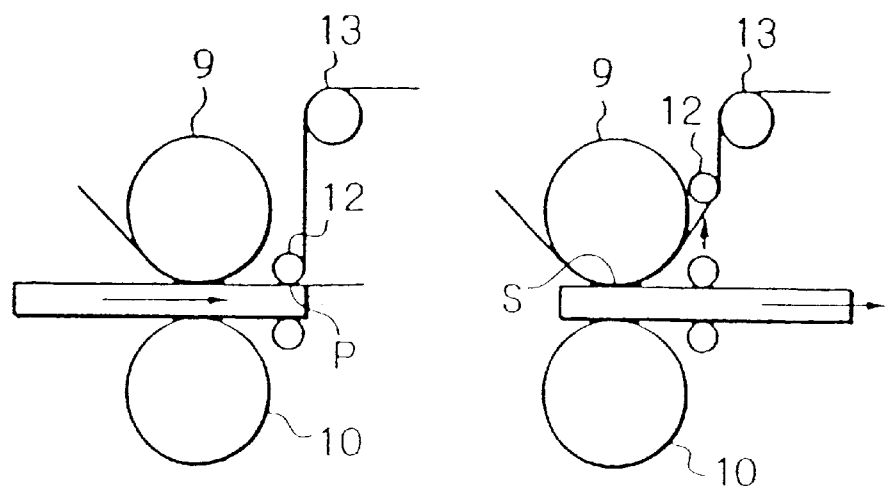
FIG. 9 is a sectional view illustrating a base film being peeled off by a movable guide roll for peeling.

As shown in FIG. 9, in the substrate to be laminated, at the frontal end part of the substrate where the base film starts to be peeled off, the peeling position of the base film is located on point P, while at the rear end part of the substrate in the transport direction of the substrate where base film peeling will be completed soon, the peeling position of the base film is moved from point P (frontal peeling position) to point S (the lowest point of the lamination roll). Thus, even if lamination operation is stopped when the inter-substrate processed part c of the film comes to the lowest point S of the lamination roll, the substrate previously transported can be discharged because the base film has been completely peeled off. That is, the substrate is prevented from being problematically stopped to wait for the next substrate during the course of peeling the base film. If peeling the base film is stopped on resist e, a mark (line) is left on the resist, which causes troubles in the subsequent exposure and developing steps. Therefore, peeling should not be stopped on the part to be used as a product. According to this invention, no peeling marks are left, because peeling is stopped at part c.

Figure 10:
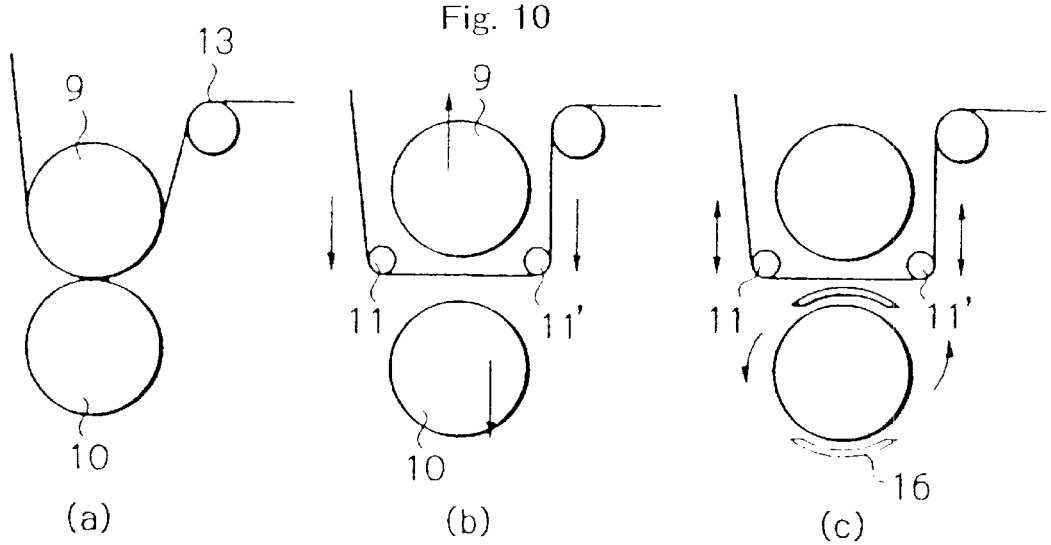
FIGS. 10($a$)–10($c$) are sectional views illustrating the operations of guide rolls, lamination rolls and a heat shield plate during substrate-waiting period.

In cases where the substrates are not transported continuously at constant intervals, in addition to the problem relating to the peeling of the base film, there arises at the time of waiting substrates another problem that the film is deteriorated by the heat of the lamination rolls during waiting for the next substrate. As shown in FIG. 10a, while waiting for the substrate, the film is positioned so that the inter-substrate processed part of the lengthy laminate film comes to the lowest point of the lamination roll. Lamination rolls are generally heated to a high temperature of 60° C. or higher. If the film stopped in contact with such a hot lamination roll, the lengthy laminate film may change its properties or deteriorate due to the high temperature. For example, when photosensitive resins are left in contact with a 100° C. roll for one minute or more, they lose photosensitivity, causing defects, such as undeveloped parts, when developed to image the exposed part. The device of this invention prevents such problems by the following means. First, to prevent the lengthy laminate film from being in contact with the roll and heated while the next substrate is waited for, substrate-waiting guide rolls 11 and 11' are located backward and forward of the lamination rolls in the transport direction of substrates, to separate the rolls from the lengthy laminate film during waiting for the next substrate. During waiting for the next substrate, guide rolls 11 and 11' or the lamination rolls are moved vertically in the directions of arrows, to provide vacant spaces between the lengthy laminate film and the lamination rolls. The vacant spaces may be provided between the film and lamination rolls 9 and 10 by moving only lamination roll 9 upward and guide rolls 11 and 11' downward, or by fixing guide rolls 11 and 11' and moving lamination roll 9 upward and lamination roll 10 downward. Further, guide roll 11' located forward of the lamination rolls in the transport direction of substrates may doubles as guide roll 12 for peeling off the base film. In this case, while the next substrate is waited for, guide roll 12 for peeling off the base film is linked to guide roll 11 to provide vacant spaces between the lamination rolls and the lengthy laminate film, and, during lamination, it operates peeling of the base film.

In cases where the standby time for waiting the next substrate is long or the roll temperature is high, the increase in the film temperature may not be prevented by the vacant spaces, which are provided between the lengthy laminate film and the lamination rolls to prevent the direct heat transfer from the rolls to the film while the next substrate is waited for. Particularly, the film is subject to heating by the current of hot air rising from the lower lamination roll 10, and may not be prevented from the increase in temperature even by a large vacant space between the film and the rolls. This invention solves the problem by inserting heat shield plate 16 in the space between the lower lamination roll 10 and the lengthy laminate film during waiting the next substrate.

Heat shield plate 16 does not come in contact with the lengthy laminate film nor the rolls, is an adiabator, and can prevent the increase of film temperature even for a long term standby or even against high roll temperatures.

Except for substrate waiting periods, as shown in FIG. 10c, it stands by somewhere around the circular surface of the roll not to disturb lamination (for example, under the lower lamination roll, as shown in FIG. 10c). The heat shield plate has a self-cooling function so as not to be heated by the rolls, and is designed to keep a constant temperature irrespective of the temperatures of the lamination rolls. Examples of the self-cooling means include cooling water or cold wind. On waiting for substrates for one minute at a roll temperature of 100° C., the film temperature stopped to increase at 30° C. by a heat shield plate, while the film temperature rose from room temperature (23° C.) up to 70° C. in the absence of the heat shield plate.

Figure 11:
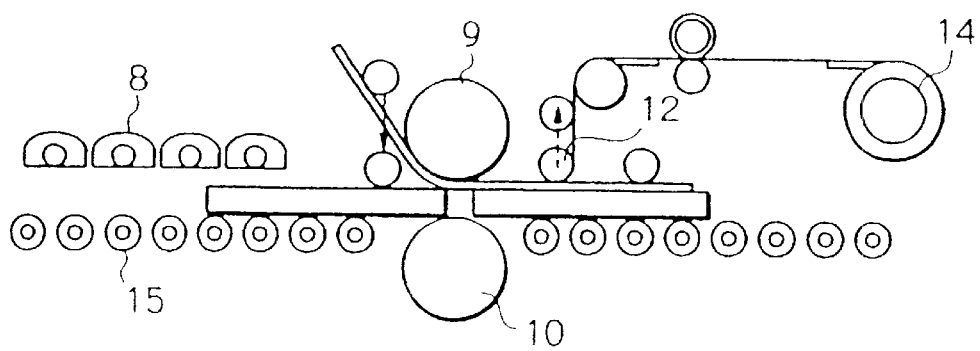
FIG. 11 is a sectional view illustrating a base film being peeled off after a resist is transferred onto a substrate.
Figure 12:
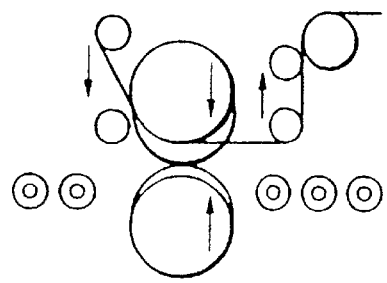
FIG. 12 is a sectional view illustrating the operations of controlling items.

FIG. 12 is a sectional view illustrating the continuous base film peeling operation by the guide roll for peeling off the base film, the movements of the guide roll and heat shield plate for waiting substrates and the movements of the controlling items of the lamination rolls, and FIG. 13 is a chart showing the changes of relating movements with passage of time. After the operations from lamination to peeling, the base film peeled off by the peeling guide roll bears the inter-substrate processed parts of the resist that remain without being transferred to substrates, and is wound up as it is at the winding part 14. FIG. 11 shows this movement.

The above-described lamination method is applicable in the fields requiring the lamination of a transfer layer, such as dry film of a laminate film, for example, printed boards and color filters.

Another embodiment according to this invention will be described hereinafter referring to drawings.

Figure 14:
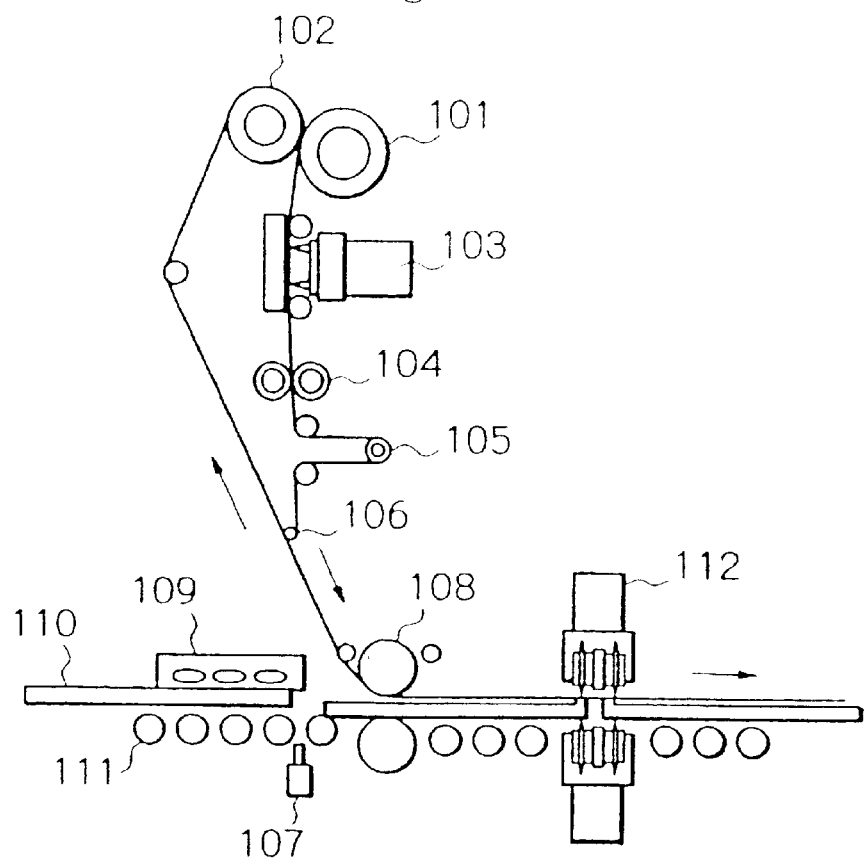
FIG. 14 is a sectional view illustrating the lamination device of this invention.

FIG. 14 shows a lamination device for laminating a dry film resist as a transfer layer. This lamination device comprises a substrate transport part, a substrate preheating part, a lamination part, an inter-substrate film processing part, a film feed part and a base film cutting-dividing part.

Figure 15:
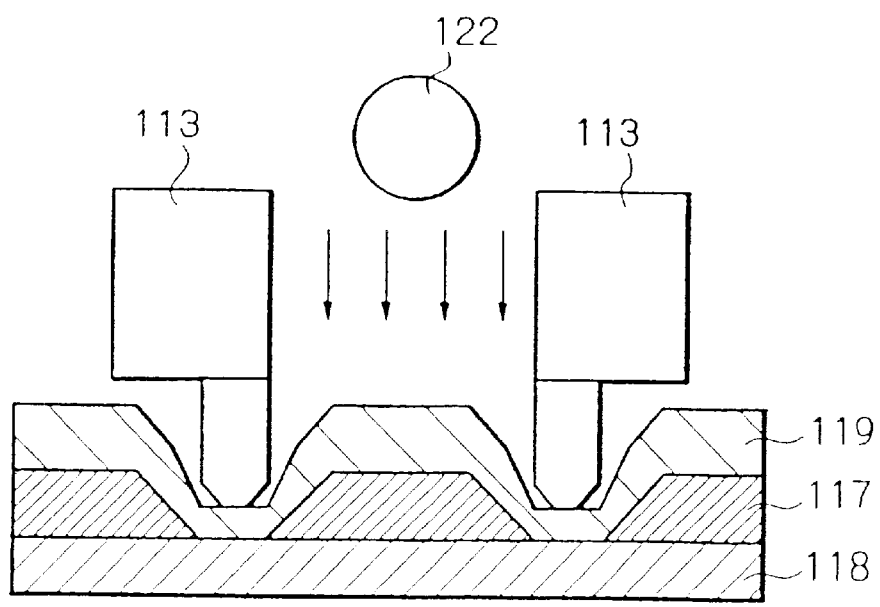
FIG. 15 is a conceptional view illustrating the details of an inter-substrate processing part used in the lamination device of this invention.

A series of lamination steps will be described referring to drawings. The film to be laminated is lengthy laminate film 101 comprising a base film and a transfer layer and a cover film formed on the base film in this order, and is fed from film feed part 104 and introduced to inter-substrate processing part 103 in a state bearing the cover film. FIG. 15 shows the details of the inter-substrate processing part. The inter-substrate processing part is the same as that described above. To give smooth cut sections to the resist (transfer layer), heating devices 113 are arranged at an interval overlapping the interval between substrates, and the interval between the heating devices 113 corresponds to the total of the interval between substrates 110 and the widths of the end parts of each substrate where lamination is not required.

The processing for giving smooth cut sections to the resist is performed, as shown in FIG. 15, by pressing heating bars 113 (heated metallic thin-plates having sharp edges) against the film (119, 117, 118) bearing cover film 119 from the outer surface of cover film 119. The edges of hearing bars 113 are rounded not to cut or damage the cover film or base film 118. The temperatures of the heating bars depend on the materials of the base film, transfer layer and cover film, and, generally preferred temperatures range from 80 to 120° C. By pressing for 1 to 10 seconds, the heating bars melt and divide resist layer 117 (transfer layer), giving smooth interfaces (cut sections) to divided resist. The cover film and the base film, except the resist layer, do not suffer such damage that disturbs continuous winding. During the processing for giving smooth cut sections to the resist, the resist is exposed by light source 122 in the region between the heating bars. As shown in FIG. 15, the resist layer is exposed to UV light (the wavelength of UV light depends on resists, and, for example, ranges from 250 to 450 nm) through the cover film. On exposure, the resist (transfer layer) cures by photopolymerization, whereby it loses the adhesiveness as a resist and is improved in the adhesiveness to the base film. So the exposed surface of the resist (transfer layer surface) does not adhere to substrates not lamination rolls, and after lamination, the exposed resist can be peeled off as it is adhering to the base film. When the base film is peeled off, the resist separates onto the base film and the substrates, and the separating interfaces (cut sections of the resist) are smooth because they were previously melt-separated by the heating bars.

After the inter-substrate processing step, the cover film is continuously wound up at the cover film winding part 102 through cover film-peeling roll 106. Accumulator 105 accumulates the lengthy laminate film for one substrate, and doubles as a tension roll for keeping the tension of the film constant. The lengthy laminate film is continuously fed to a lamination roll part. On the other hand, the substrates to which the resist is to be transferred are fed to a substrate preheating part, wherein pre-heater 109 9such as a far infrared heater) heats substrates 110 to a desired temperature (the temperature depends on the kind of the resist, and is generally 40 to 100° C.). After heated uniformly from both surfaces, the substrates are fed to a lamination part. The positions of substrates 110 and the lengthy laminate film are always controlled, for example, by sensor 107 for controlling end positions, so that the substrates come to the inter-substrate processed part of lengthy laminate film 101. Throughout lamination, accumulation roll 105 controls tension so that the film is always applied with a constant tension irrespective of the presence of the substrates. This the film has uniform ability for burying irregularities in a plane.

Figure 16:
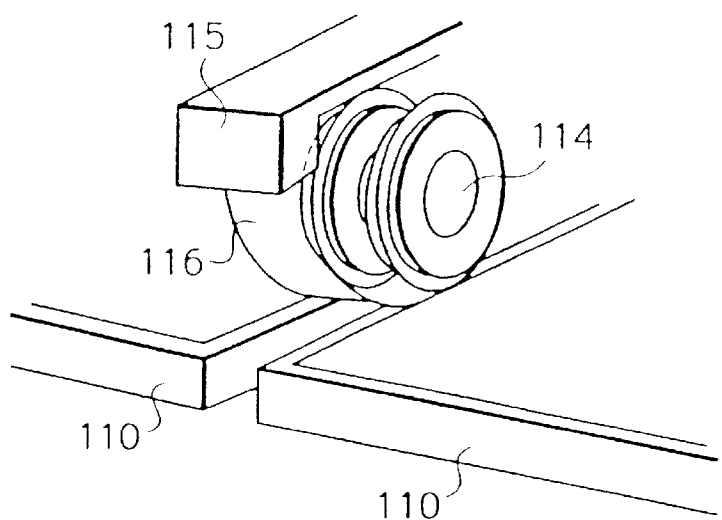
FIG. 16 is a perspective view of a device for half-cutting a base film on substrates.
Figure 17:
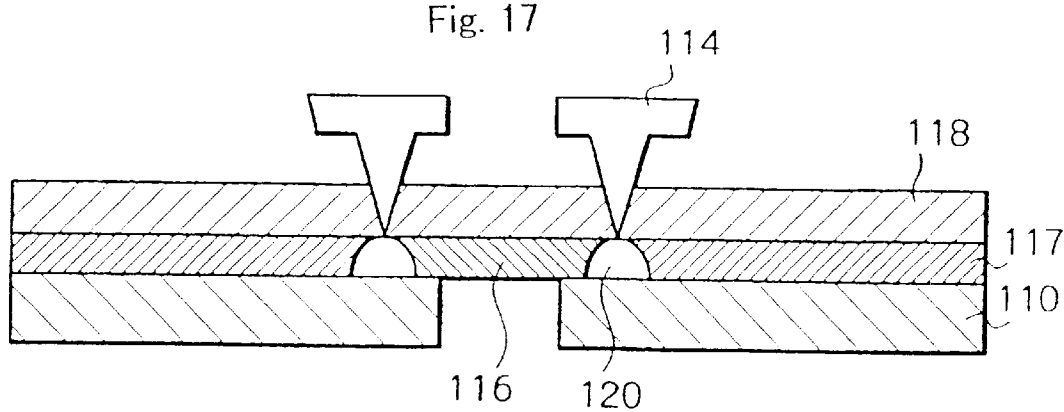
FIG. 17 is a sectional view illustrating a film and substrates, which are being half-cut.
Figure 18:
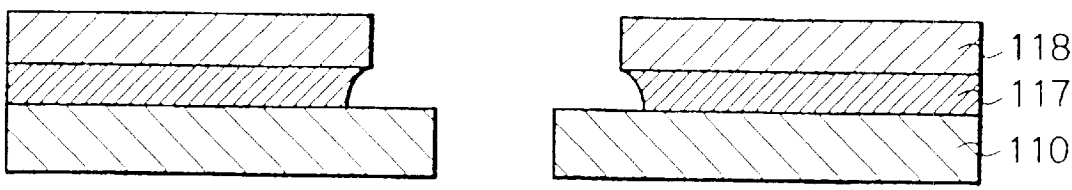
FIG. 18 is a sectional view illustrating films separated and left on substrates after lamination.

A pair of lamination rolls 108 perform lamination. The parts 111 are transport rolls. After lamination, the base film is cut on the substrate by half cutting. FIG. 16 is a perspective view showing a device (112, FIG. 14) for half cutting the base film on the substrate, and FIG. 17 shows the sections of the film and the substrate, which are being half cut. The base film is cut by half cut edges 114 on positions 120 where the transfer layer is previously separated by the heating bars during the inter-substrate processing. Half cutting is preferably controlled so as to cut the base film alone. After half cutting, inter-substrate processed film 116 on the substrate is peeled by film peeling device 115, with its end part caught by the film-peeling device 115, whereby film 116 is separated as shown in FIG. 18. As an alternative to the method of peeling by catching the end part of the film, the inter-substrate part may be peeled off by drawing the whole film surface of the inter-substrate part by suction.

The inter-substrate processed resist is not transferred to the substrate and remains adhering to base film 118 peeled off. The resist that borders the interfaces made by melt-separation using the heating bars during the inter-substrate processing adheres to the substrate within its surface, together with the base film that was half cut on the substrate. Being melt-separated by the heating bars, the interfaces are smooth, and no cutting chips of the resist are scattered.

Examples of usable base films are 10 to 100μm thick polyethylene terephthalate films, examples of usable transfer layers are 0.1 to 50μm thick layers of photosensitive materials, and examples of usable cover films are 5 to 50μm thick oriented polyethylene films.

In addition to the base film and the transfer layer and the cover film formed on the base film in this order, the lengthy laminate film may further has other layers, such as a cushion layer interposed between the base film and the transfer layer.

The above-described lamination method is applicable in the fields requiring the lamination of the transfer layer, such as dry film of a laminate film, for example, printed boards and color filters.

INDUSTRIAL APPLICABILITY

By the device and method for lamination according to this invention, a transfer layer, such as resist, can be continuously laminated to substrates at high speed with accurate positioning, without forming a transferred layer having uneven thickness.

What is claimed is:

1. A lamination method comprising:

feeding, between a pair of lamination rolls facing each other, substrates fed at prescribed intervals and a laminate film comprising a base film and a transfer layer formed thereon, so that the transfer layer faces the substrate, and continuously peeling off the base film, characterized in that, at a frontal end part of each substrate, the base film is peeled off at a peeling angle $\theta_1$ by a guide roll for peeling off the base film, said guide roll being located, in a transport direction of the substrates, forward of the lamination roll, of the pair of lamination rolls, on the side of the laminate film and being smaller in diameter than the lamination roll on the side of the laminate film, and wherein the guide roll for peeling off the base film is moved so that, at a rear end part of each substrate, the base film is peeled off at a peeling angle $\theta_2$, smaller than the peeling angle $\theta_1$, by the lamination roll on the side of the laminate film.

2. The lamination method of claim 1, wherein the diameter of the guide roll for peeling off the base film is at most one-third as large as the diameter of the lamination roll on the side of the laminate film.

3. The lamination method of claim 1, wherein the lamination roll on the side of the laminate film is a heating roll, and the guide roll for peeling off the base film is a non-heating roll.

4. A lamination method comprising:
feeding, between a pair of lamination rolls facing each other, substrates fed at prescribed intervals and a laminate film comprising a base film and a transfer layer formed thereon, so that the transfer layer faces the substrate, and
continuously peeling off the base film,
characterized in that a space is provided between each of the lamination rolls and the laminate film by vertically moving the lamination rolls or guide rolls, which guide rolls are located, in the transport direction of the substrates, forward and backward of the lamination roll on the side of the laminate film, respectively.

5. The lamination method of claim 4, characterized in that after the space is provided between the lamination rolls and the laminate film by vertically moving the lamination rolls or the guide rolls, a heat shield plate is inserted in the space.

6. The lamination method of claim 5, wherein the heat shield plate is cooled.

7. A lamination method for continuously laminating onto substrates, which are continuously fed and arranged at prescribed intervals, a transfer layer of a laminate film comprising a base film and the transfer layer and a cover film which are formed on the base film in this order, characterized in comprising:
a step of continuously feeding the laminate film,
a step of pressing heating bars against the laminate film from the outer surfaces of the cover film without cutting the cover film, to give the transfer layer a divided region corresponding to a total of an interval between two substrates and the widths of end parts of one substrate where lamination is not required,
a step of exposing the transfer layer to light at the divided region which lies between the heating bars and corresponds to a total of the interval between the two substrates and the widths of the end parts of one substrate where lamination is not required, the transfer layer at the divided region being cured by photopolymerization due to the exposure to the light,
a step of continuously peeling off the cover film,
a step of laminating the transfer layer onto the substrates, which are continuously fed and arranged at prescribed intervals, so that the divided region of the transfer layer, made by the heating bars, is positioned on the end parts of the substrates and between substrates, where lamination is not required,
a step of half cutting the base film on the substrates at the parts pressed by the heating bars, and
a step of peeling off the cut base film together with the transfer layer that was exposed to light.

8. A lamination device for laminating a transfer layer on substrates, comprising:
a mechanism for exposing the transfer layer to be laminated onto the substrates to light in a region of the transfer layer corresponding to end parts of a substrate, of the substrates, and to a space between the substrate and another substrate, so that said region of the transfer layer exposed to light is cured by photopolymerization and does not adhere to lamination rolls nor to parts of substrates where the transfer of the transfer layer is not required;
a lamination mechanism;
a substrate transport mechanism for feeding substrates to the lamination mechanism at prescribed intervals;
a laminate film transport mechanism for feeding a laminate film comprising a base film and the transfer layer formed on the base film, to the lamination mechanism, so that the transfer layer faces the substrate; and
a peeling mechanism for continuously peeling off the base film after lamination,
wherein the lamination mechanism and the peeling mechanism comprise a pair of lamination rolls facing each other and a guide roll for peeling off the base film, said guide roll being located, in a transport direction of the substrates, forward of the lamination roll and positioned on the side of the laminate film so as to have the laminate film between the guide roll and the substrate.

9. The lamination method of claim 1, wherein the guide roll for peeling off the base film has a diameter of 30 mm or less.

10. The lamination method of claim 2, wherein the guide roll for peeling off the base film has a diameter of 30 mm or less.

11. The lamination method of claim 4, wherein the guide roll located, in the transport direction of the substrate, forward of the lamination roll on the side of the laminate film, doubles as a guide roll for peeling off the base film.

12. The lamination method of claim 5, wherein the guide roll located, in the transport direction of the substrate, forward of the lamination roll on the side of the laminate film, doubles as a guide roll for peeling off the base film.

13. The lamination method of claim 6, wherein the guide roll located, in the transport direction of the substrate, forward of the lamination roll on the side of the laminate film, doubles as a guide roll for peeling off the base film.

14. The lamination device of claim 8, wherein the guide roll can peel off the base film at a peeling angle by, and is movable so that, at a rear end part of each substrate, the base film can be peeled off at a peeling angle $\theta_2$, smaller than the peeling angle $\theta_1$, by the lamination roll on the side of the laminate film.

15. The lamination device of claim 8, wherein the laminate film transport mechanism is for feeding an elongated laminate film wound out from a film feed part.

16. The lamination device of claim 8, wherein the laminate film transport mechanism is for feeding a web of the laminate film.

17. The lamination method of claim 7, wherein the laminate film is an elongated laminate film and is wound out from a film feed part.

18. The lamination method of claim 7, wherein the laminate film is a web of laminate material which includes the base film, the transfer layer and the cover layer.

19. The lamination method of claim, wherein the laminate film is an elongated laminate film and is wound out from a film feed part.

20. The lamination method of claim 4, wherein the laminate film is a web of laminate material which includes the base film and the transfer layer.

21. The lamination method of claim 1, wherein the laminate film is an elongated laminate film and is wound out from a film feed part.

22. The lamination method of claim 1, wherein the laminate film is a web of laminate material which includes the base film and the transfer layer.

* * * * *